United States Patent
Doellgast et al.

(10) Patent No.: US 10,827,599 B2
(45) Date of Patent: Nov. 3, 2020

(54) PIEZOELECTRIC TRANSFORMER

(71) Applicant: EPCOS AG, Munich (DE)

(72) Inventors: Bernhard Doellgast, Deutschlandsberg (AT); Markus Puff, Graz (AT); Pavol Kudela, Deutschlandsberg (AT); Michael Weilguni, Hagenburg (AT)

(73) Assignee: EPCOS AG, Munich (DE)

( * ) Notice: Subject to any disclaimer, the term of this patent is extended or adjusted under 35 U.S.C. 154(b) by 598 days.

(21) Appl. No.: 15/327,642

(22) PCT Filed: Jul. 10, 2015

(86) PCT No.: PCT/EP2015/065886
§ 371 (c)(1),
(2) Date: Jan. 19, 2017

(87) PCT Pub. No.: WO2016/012282
PCT Pub. Date: Jan. 28, 2016

(65) Prior Publication Data
US 2017/0208675 A1  Jul. 20, 2017

(30) Foreign Application Priority Data
Jul. 23, 2014 (DE) .......... 10 2014 110 405

(51) Int. Cl.
*H01L 41/047* (2006.01)
*H01L 41/053* (2006.01)
(Continued)

(52) U.S. Cl.
CPC .......... *H05H 1/2475* (2013.01); *H01L 41/047* (2013.01); *H01L 41/0533* (2013.01); *H01L 41/107* (2013.01); *H05H 2001/2481* (2013.01)

(58) Field of Classification Search
CPC .......... H01L 41/107; H01L 41/044
(Continued)

(56) References Cited

U.S. PATENT DOCUMENTS 4,051,448 A   9/1977  Coussot
5,847,490 A  12/1998  Kumasaka et al.
(Continued)

FOREIGN PATENT DOCUMENTS

JP    S62200812 A   9/1987
JP    S6363209 A    3/1988
(Continued)

OTHER PUBLICATIONS

"Piezoelektrischer Transformator", retrieved from <http://de.wikipedia.org/wiki/Piezoelektrischer_Transformator> on Jun. 3, 2015, Wikipedia, 3 pgs.
(Continued)

*Primary Examiner* — Derek J Rosenau
(74) *Attorney, Agent, or Firm* — Morgan, Lewis & Bockius LLP

(57) ABSTRACT

The present invention relates to a piezoelectric transformer (1) which is divided in the longitudinal direction (L) into an input region (2) and an output region (3), wherein electrodes (4) and piezoelectric material (5) are alternately stacked in the input region (2) and an alternating voltage can be applied to the electrodes (4) in the input region (2), wherein the output region (3) comprises piezoelectric material (9) which effectuates the build-up of an electrical field when alternating voltage is applied in the input region (2), wherein the piezoelectric transformer (1) has an output-side end face (10) which faces away from the input region (2), and lateral edges (13) which extend in the longitudinal direction (L), and wherein the piezoelectric transformer (1) is designed for ionizing atoms or molecules at the output-side end face (10), thereby avoiding ionization of atoms or molecules at the lateral edges (13).

19 Claims, 4 Drawing Sheets

(51) Int. Cl.
  *H05H 1/24* (2006.01)
  *H01L 41/107* (2006.01)
(58) Field of Classification Search
  USPC .......................................................... 310/318
  See application file for complete search history.

(56) References Cited

U.S. PATENT DOCUMENTS

| | | | |
|---|---|---|---|
| 5,929,554 A | | 7/1999 | Kanayama et al. |
| 6,221,271 B1 | | 4/2001 | Watanabe et al. |
| 6,448,698 B1* | | 9/2002 | Okuda .................. H01L 41/083 310/359 |
| 2004/0174098 A1* | | 9/2004 | Hsu ....................... H01L 41/107 310/366 |
| 2007/0278906 A1* | | 12/2007 | Florian ................. H01L 41/107 310/359 |
| 2009/0107698 A1* | | 4/2009 | Cheng .................. H01L 41/107 174/138 R |
| 2009/0122941 A1 | | 5/2009 | Engemann et al. |

FOREIGN PATENT DOCUMENTS

| | | |
|---|---|---|
| JP | H0652161 U | 7/1994 |
| JP | H09181372 A | 7/1997 |
| JP | H1012939 A | 1/1998 |
| JP | H11274595 A | 10/1999 |
| JP | 2000323765 A | 11/2000 |
| JP | 2003038932 A | 2/2003 |
| JP | 2009501409 A | 1/2009 |
| JP | 2014107202 A | 6/2014 |
| KR | 1020080037026 | 4/2008 |
| WO | 2007006298 A2 | 1/2007 |
| WO | 2007119174 A2 | 10/2007 |

OTHER PUBLICATIONS

Benwell, Andrew, et al, "Flashover Prevention of High Voltage Piezoelectric Transformers by Thin Film Encapsulation", IEEE Transactions on Plasma Science, vol. 38, No. 12, Dec. 2010, pp. 3455-3459.

Itoh, et al., "Discharge Plasmas Generated by Piezoelectric Transformers and their Applications", Institute of Physics Publishing, 2006, pp. S51-S61.

Nadal, C. et al., "First Approach for the Modeling of the Electric Field Surrounding a Piezoelectric Transformer in view of Plasma Generation", IEEE Transactions on Magnetics, USA, Feb. 2012, vol. 48, No. 2, pp. 423-425.

* cited by examiner

PIEZOELECTRIC TRANSFORMER

The present invention relates to a piezoelectric transformer. The piezoelectric transformer can be used, in particular, in a device for generating atmospheric-pressure plasmas.

A piezoelectric transformer is a design of a tuned transformer which is based on piezoelectricity and, in contrast to conventional magnetic transformers, is an electromechanical system. FIG. 1 shows a piezoelectric transformer 1 which is also known as a Rosen-type transformer.

The piezoelectric transformer 1 comprises an input region 2 and an output region 3. In the input region 2, the piezoelectric transformer 1 comprises electrodes 4, to which an alternating voltage can be applied. The electrodes 4 extend in a longitudinal direction L of the piezoelectric transformer 1. The electrodes 4 are stacked in alternation with a piezoelectric material 5 in a stacking direction S which is perpendicular to the longitudinal direction L. The piezoelectric material 5 is polarized in the stacking direction S in this case.

The electrodes 4 are situated in the interior of the piezoelectric transformer 1 and are also referred to as internal electrodes. The piezoelectric transformer 1 has a first longitudinal side 6 and a second longitudinal side 7 which is opposite the first longitudinal side 6. A first external electrode 8 is situated on the first longitudinal side 6. A second external electrode (not shown) is situated on the second longitudinal side 7. The internal electrodes 4 are electrically contacted, in the stacking direction S, in alternation with either the first external electrode 8 or the second external electrode.

The input region 2 can be controlled by means of a low alternating voltage which is applied between the electrodes 4. Due to the piezoelectric effect, the alternating voltage applied on the input side is initially converted into a mechanical vibration. The frequency of the mechanical vibration is essentially dependent, in this case, on the geometry and the mechanical design of the piezoelectric transformer 1.

The output region 3 comprises piezoelectric material 9 and is free from internal electrodes. The piezoelectric material 9 in the output region is polarized in the longitudinal direction L. The piezoelectric material 9 of the output region 3 can be the same material as the piezoelectric material 5 of the input region 2, wherein the piezoelectric materials 5 and 9 can differ in terms of the polarization direction thereof.

If an alternating voltage is applied to the electrodes 4 in the input region 2, a mechanical wave forms within the piezoelectric material 5, 9 and, due to the piezoelectric effect, generates an output voltage in the output region 3. The output region 3 comprises an output-side end face 10 which is metallized and forms an output electrode. The electrical voltage generated in the output region 3 is therefore present between the metallized end face 10 and the end of the electrodes 4 of the input region 2. A high voltage is present at the output-side end face 10 in this case.

In this way, the piezoelectric transformer 1 generates high electrical fields which are capable of ionizing gasses by means of electrical excitation. In this case, atoms or molecules of the particular gas are ionized and form a plasma. Ionization always takes place when the electrical field strength on the surface of the piezoelectric transformer 1 exceeds the ignition field strength of the plasma. The ignition field strength of a plasma is the field strength required for ionizing the atoms or molecules.

The publication Ito et al.: Discharge plasmas generated by piezoelectric transformers and their applications, Plasma Sources Sci. Technol. 15 (2006) describes that piezoelectric transformers can be used for igniting a plasma. Said publication describes that the ignition of the plasma takes place both on the lateral longitudinal edges and on the edges of the output-side end face.

An ignition 11 of plasma on the output-side end face and further ignitions 12 of plasma on the lateral edges 13 are indicated in FIG. 1.

In the aforementioned publication, it was not acknowledged, however, that the ignitions on the lateral edges result in reactions, in the case of which high mechanical stresses are generated in the piezoelectric material in the output region and can result in cracks during the operation of the piezoelectric transformer, thereby reducing the service life of the piezoelectric transformer.

The problem addressed by the present invention is therefore that of providing an improved piezoelectric transformer which has a longer service life, for example.

The aforementioned problem is solved by a piezoelectric transformer according to the present claim 1.

A piezoelectric transformer is provided, which is divided in the longitudinal direction into an input region and an output region, wherein electrodes and piezoelectric material are alternately stacked in the input region and an alternating voltage can be applied to the electrodes in the input region, wherein the output region comprises piezoelectric material which effectuates the build-up of an electrical field when alternating voltage is applied in the input region, wherein the piezoelectric transformer has an output-side end face which faces away from the input region, and has lateral edges which extend in the longitudinal direction, and wherein the piezoelectric transformer is designed for ionizing atoms or molecules at the output-side end face, thereby avoiding ionization of atoms or molecules at the lateral edges.

Given that an ionization of atoms or molecules at the lateral edges is avoided, it is ensured that an undesirable reaction does not take place when plasmas are ignited at the lateral edges. Such reactions would otherwise result in mechanical stress peaks which would result in cracks in the piezoelectric material and, therefore, in a shortened service life of the piezoelectric transformer. The occurrence of such cracks is therefore avoided by means of the present invention, and therefore the service life of the piezoelectric transformer is increased.

The piezoelectric transformer can be the above-described Rosen-type transformer, wherein, in addition, measures are provided for avoiding the ionization of atoms or molecules at the lateral edges. All the structural and functional features which were disclosed in connection with the Rosen-type transformer can also be present in the piezoelectric transformer according to the invention.

In particular, the input region can comprise electrodes and piezoelectric material which are stacked in alternation in a stacking direction. The stacking direction is perpendicular to the longitudinal direction in this case. The stacking direction is furthermore perpendicular to the surface normal of the first longitudinal side 6 on which the first external electrode 8 is situated.

The output region is free from internal electrodes. The output region is a monolithic stack comprising the piezoelectric material, wherein the output-side end face can be metallized. The output region comprises piezoelectric material which is polarized in the longitudinal direction.

The input region is also referred to as an excitation zone and the output region is also referred to as a high-voltage zone.

The piezoelectric transformer has an essentially cuboid shape. The longitudinal direction is defined by the connection of the outer surfaces of the piezoelectric transformer located furthest apart from one another, i.e., as the direction along the longest edge of the piezoelectric transformer.

In order to ensure a targeted control of the ionization of atoms or molecules on the output-side end face while avoiding ionizations on the lateral edges, it is decisive that the electrical field strength reaches its maximum at the output-side end face. The lateral edges can therefore be modified in such a way that the field strength of the electrical field is specifically reduced here and, in particular, the occurrence of stress peaks is avoided. In particular, the electrical field strength on the lateral edges should lie below the ignition field strength of the plasma when the electrical field strength on the output-side end face reaches the ignition field strength.

The lateral edges of the piezoelectric transformer can have a rounded region. Stress peaks are avoided in this rounded region, and so an ionization of atoms or molecules does not take place on the lateral edges. Due to the rounding of the edges, the electrical field strength is reduced on the surface of the lateral edge.

The edges can be rounded before or after sintering.

The rounded region can extend at least from the output-side end face up to the middle of the output region. The greatest electrical field strength is present in this region during the operation of the piezoelectric transformer. It is important, therefore, to reduce the field strength at the edges in this region, in particular, in order to avoid an undesirable ignition of a plasma. Preferably, the rounded region directly adjoins the output-side end face, since the danger of undesirable ionizations on the lateral edges is particularly great close to the output-side end face.

The rounded region can extend along the entire length of the lateral edges. In certain methods for manufacturing the rounded region, for example, rubbing, it is substantially easier to round the lateral edges along the entire length thereof. A rounding of the lateral edges in the input region as well does not negatively influence the functionality of the piezoelectric transformer.

The lateral edges can have a radius between 0.1 mm and 3 mm in the rounded region. If the radius were selected to be less than 0.1 mm, a sufficient reduction of the electrical field strength on the lateral edges would no longer be ensured, since this reduction would be approximately angular in this case. A rounding having a radius of 3 mm is more than sufficient in order to adequately reduce the electrical field strength at the edges, and so a rounding having an even larger radius would not result in a further improvement of the behavior of the piezoelectric transformer. The range for the radius between 0.1 mm and 3 mm is therefore optimal. Preferably, the radius can furthermore lie between 0.2 mm to 1.0 mm.

The rounded region of the lateral edges can be rounded, for example, by means of rubbing, grinding, or sandblasting.

In this case, rubbing refers to a method in which all edges of the piezoelectric transformer, in the unsintered, green state thereof, are rubbed off by means of loose grain. In this case, a multitude of piezoelectric transformers can be placed in a drum along with a rubbing means and, therein, can be rubbed against each other, whereby the edges are rounded off. The advantages of rubbing are that this method can be carried out very quickly and cost-effectively.

As a result of rubbing, the edges and corners of the output-side end face are also rounded off. A piezoelectric transformer is thereby obtained, which has a rounded, output-side end face, in the case of which ionization takes place only on the corners of the end face. Due to the rounding, the corners of the end face have an enlarged surface, and so a widely fanned plasma jet results. This can be advantageous for certain applications. If a fanning of the plasma jet is not desirable for the application, the end face can be ground after the rubbing, whereby the rounded edges of the end face become angular again.

In this case, grinding refers to a method in which a grinding disk is utilized on the piezoelectric transformer in the sintered state thereof. The piezoelectric transformer can be treated highly precisely in this case. In particular, the edges on the end face can be left untreated. Grinding offers great flexibility in terms of design. For example, the rounded region can be configured by means of grinding in such a way that said region has a decreasing radius. The radius of the rounded region can be maximal on the output-side end face and can decrease toward the input side. Grinding also makes it possible to bring the end face into a desired shape. The end face can be designed, for example, to be hemispherical or to taper to a point in the manner of a pyramid. The configuration of the end face determines the shape of the plasma jet which can be generated.

A further advantage of grinding is that this method results in a very smooth surface, and so local field non-uniformities at irregular points cannot occur.

In the case of sandblasting, the lateral edges are blasted with loose grain using compressed air. In this way, material is removed from the lateral edges. Sandblasting can be carried out in the sintered state of the piezoelectric transformer. The regions of the piezoelectric transformer which are supposed to be left untreated during sandblasting can be covered, for example, masked off, during sandblasting.

If the lateral edges are rounded off, the mass of the piezoelectric transformer is changed only to such a low extent that the vibration response of the piezoelectric transformer does not change.

Alternatively or additionally, the output region can be coated at least partially with an insulation layer. The insulation layer reduces the electrical field strength on the surface of the regions covered by the insulation layer. The insulation layer can at least partially cover the lateral edges, in particular.

Due to the insulation layer, it can be ensured, in this way, that the electrical field strength on the surface of the lateral edges is not too great and, therefore, an ionization of atoms and/or molecules on the lateral edges can be prevented. The application of the insulation layer can be combined with the rounding of the lateral edges, in order to avoid an undesirable ionization on the lateral edges as a result of the combination of these two measures.

The insulation layer can have a length which lies in the range from 15% to 45% of the total length of the piezoelectric transformer, preferably in the range from 20% to 30% of the total length.

The insulation layer can comprise heat shrink tubing. The heat shrink tubing can be coated, in particular, with a hot-melt adhesive on the inner side thereof. In this way, the heat shrink tubing can be prevented from coming loose from the piezoelectric transformer, due to vibrations of the piezoelectric transformer during operation, and slipping off the output region.

The heat shrink tubing can terminate so as to be flush with the output-side end face or can extend beyond the end face. Alternatively, an end region of the output region, which adjoins the output-side end face, can also remain free from the heat shrink tubing.

If the heat shrink tubing overhangs slightly, a bundling of the plasma occurs. This is advantageous for applications which utilize the effect of the plasma in order to activate surfaces, for example. If the heat shrink tubing terminates so as to be flush with the piezoelectric transformer or leaves a small end region—which does not exceed 2 mm—of the lateral edges exposed, the plasma is not directed. An operation in an oxygen-containing working gas more ozone therefore results, which can be advantageous for medical applications. The length of the heat shrink tubing should therefore be adapted to the desired purpose.

The insulation layer can comprise at least one selected from silicone, a cured polymer, or a varnish. These materials can be applied in liquid form as an insulation layer. Liquid casting, application by means of a mold, or spraying is suitable for this purpose.

The insulation layer should have a sufficient thickness along the lateral edges. When the insulation layer is applied in liquid form, this thickness can be ensured by adjusting the viscosity or by means of multiple applications.

The end face can be free from the insulation layer. This is important, since an ionization of the atoms or molecules on the end face is desirable and should not be impeded by the insulation layer.

The insulation layer can have a thickness in the range from 0.1 mm to 3 mm, wherein the thickness preferably lies between 0.2 mm and 1.0 mm. Due to the insulation layer, an additional mass is added to the piezoelectric transformer, whereby the vibration response thereof changes. Therefore, the insulation layer should be selected so as to be as thin as possible. Said insulation layer must be thick enough, however, to reduce the field strength on the surface of the lateral edges to below the ignition field strength of the plasma. These requirements are met with insulation layers having a thickness between 0.1 mm and 3 mm.

The piezoelectric transformer can be used for generating cold atmospheric plasma.

The atmospheric-pressure plasmas can be classified into so-called cold, non-thermal plasmas having a gas temperature of typically less than 100° C. and thermal plasmas having higher gas temperatures. The present invention relates to cold, non-thermal plasmas which have the advantage that the gas temperature lies in the order of magnitude of room temperature or only slightly above room temperature, and so a longer dwell time of the plasma on a substrate to be treated is also possible and sensitive substrates, e.g., thin polymer films, can also be treated longer with this plasma without the surface of the substrate or the substrate itself becoming damaged.

The piezoelectric transformer can be a Rosen-type transformer.

Furthermore, the output-side end face can comprise rounded edges and/or rounded corners. The output-side end face can be suitable for generating a widely fanned plasma jet.

The present invention further relates to a device for generating atmospheric-pressure plasma, which device comprises the above-described piezoelectric transformer which is situated in a gas-filled volume. The piezoelectric transformer is therefore used for ionizing the gas and, in this way, generates the plasma. Such a device can be used, in particular, for activating or otherwise processing surfaces and for medical applications.

The present invention is described in greater detail in the following with reference to figures.

Figure 1:
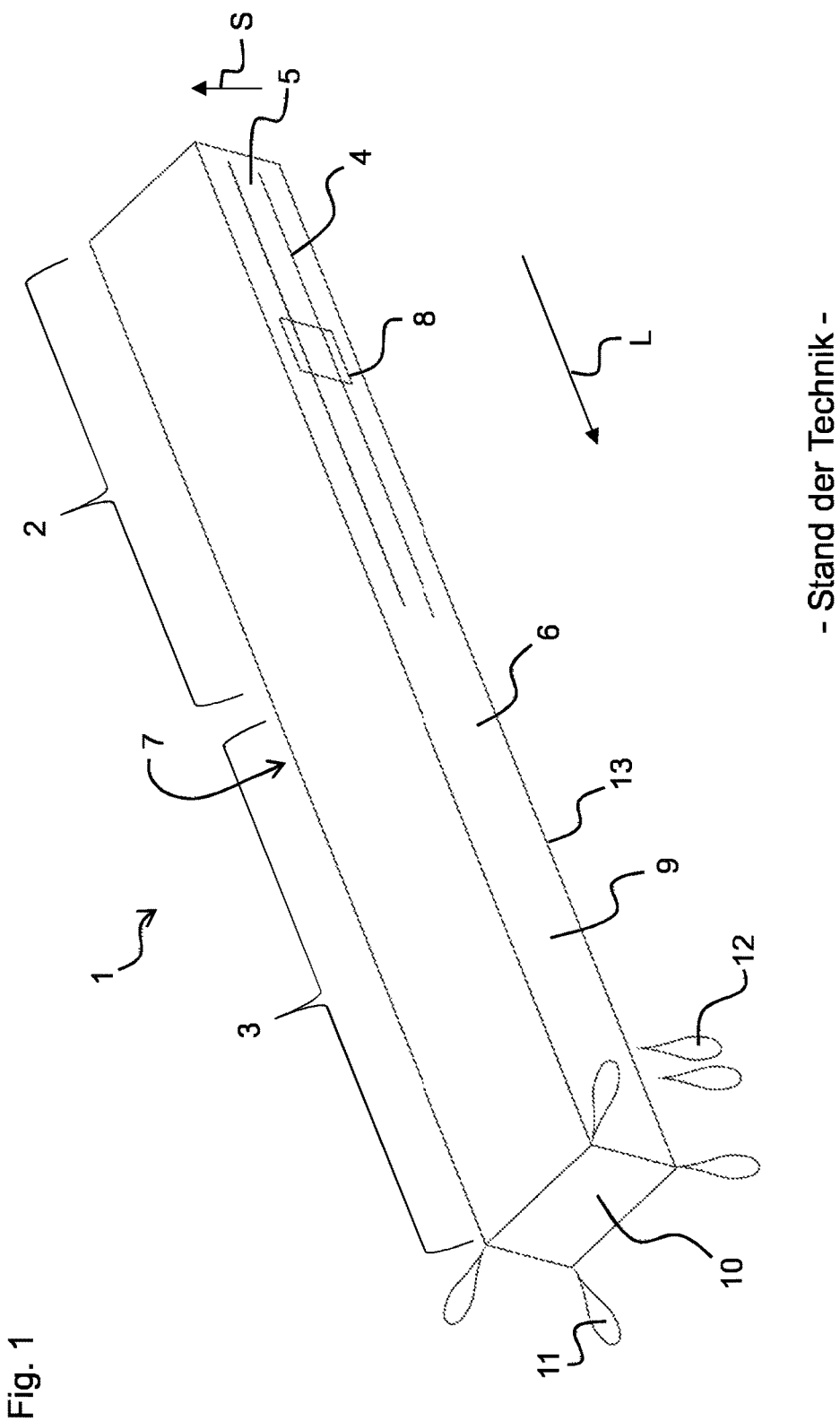
FIG. 1 shows a piezoelectric transformer which is known in the prior art.
Figure 2:
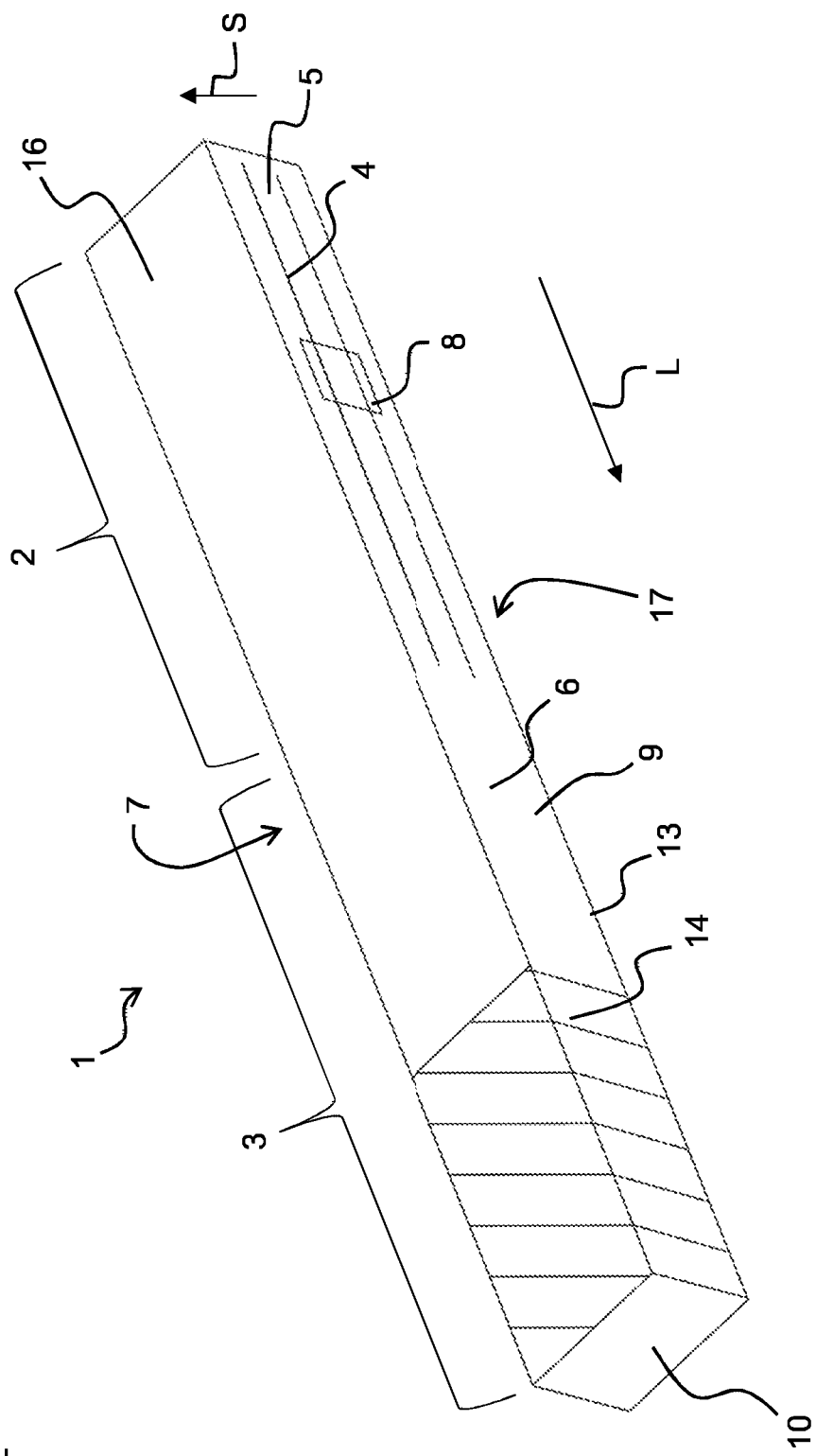
FIG. 2 shows a piezoelectric transformer according to a first exemplary embodiment of the present invention.

FIG. 2 shows a piezoelectric transformer 1. The piezoelectric transformer 1 comprises the first and the second longitudinal sides 6, 7 as well as a third longitudinal side 16 and a fourth longitudinal side 17. Each of the longitudinal sides 6, 7, 16, 17 extends in the longitudinal direction L. Each of the longitudinal sides 6, 7, 16, 17 is furthermore perpendicular to the output-side end face 10.

Approximately one-fourth of the total length of the piezoelectric transformer 1 is covered by an insulation layer 14. The insulation layer 14 is applied onto the longitudinal sides 6, 7, 16, 17 in this case. The output-side end face 10 is free from the insulation layer.

The material of the insulation layer 14 is selected in such a way, in this case, that an electrical field strength which is present in the interior of the insulation layer 14 is substantially reduced on the outward-facing side of the insulation layer 14. The insulation layer 14 therefore insulates the electrical field. The electrical field strength is therefore substantially reduced in the regions of the lateral edges 13 covered by the insulation layer 14.

The insulation layer 14 can either be a heat shrink tubing or a layer consisting of silicone, a varnish, or a cured polymer. The insulation layer 14 extends from the output-side end face 10 up to a length of one-fourth of the piezoelectric transformer.

Figure 3:
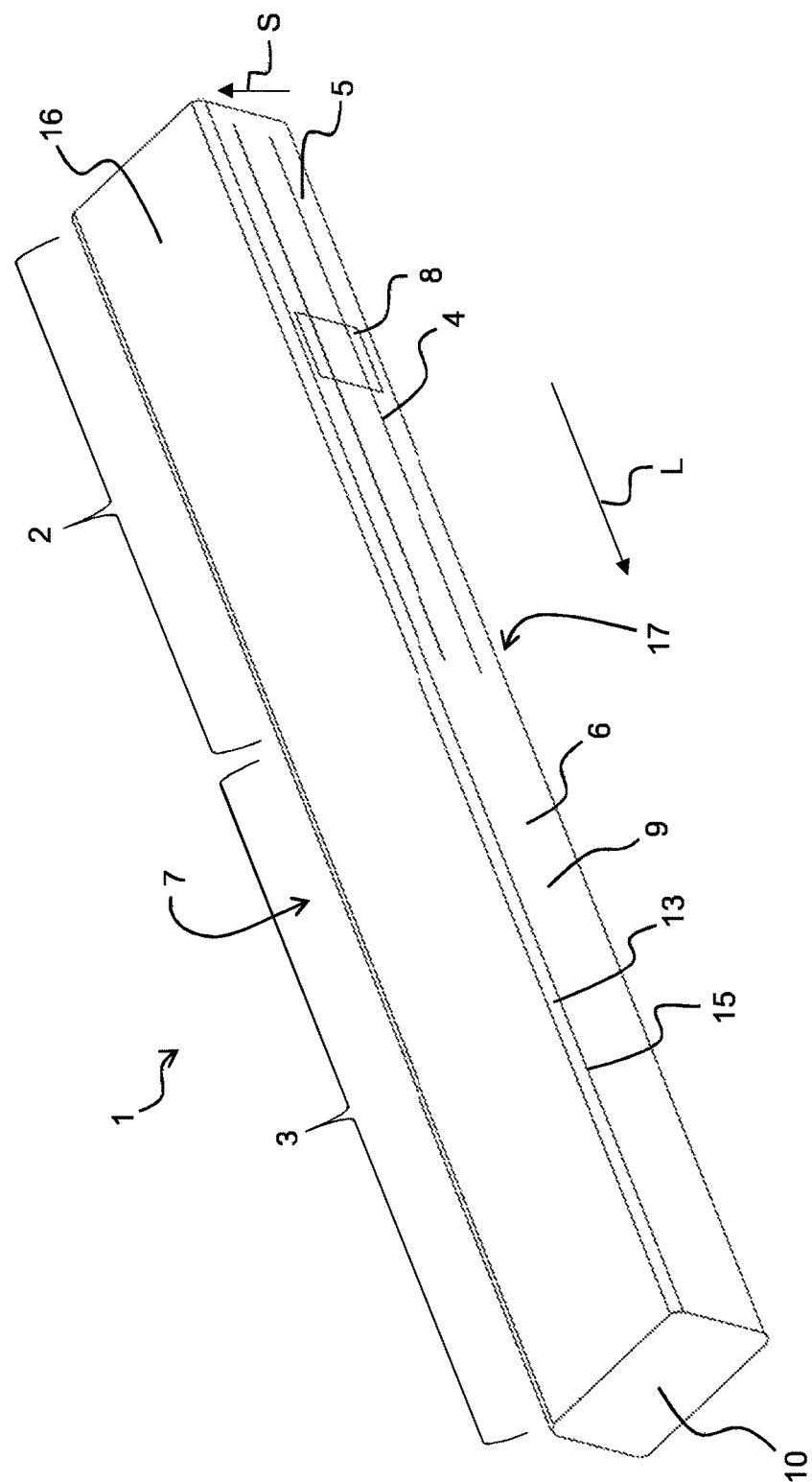
FIG. 3 shows a piezoelectric transformer according to a second exemplary embodiment of the present invention.

FIG. 3 shows a first exemplary embodiment of a piezoelectric transformer 1. The lateral edges 13 of the piezoelectric transformer 1 have a rounded region 15 in this case. In the rounded region 15, the lateral edges 13 are not angular as in the remaining regions, but rather are rounded. In the exemplary embodiment shown in FIG. 3, the rounded region 15 extends along the entire length of the lateral edges 13.

In the rounded region 15, the electrical field strength on the lateral edges 13 is distributed over a larger area, and so the occurrence of stress peaks is avoided and the maximum electrical field strength achieved is reduced in the region of the lateral edges 13. In particular, the electrical field strength on the lateral edges 13 is reduced to such an extent that the electrical field strength is less than the field strength required for ionizing atoms or molecules.

Figure 4:
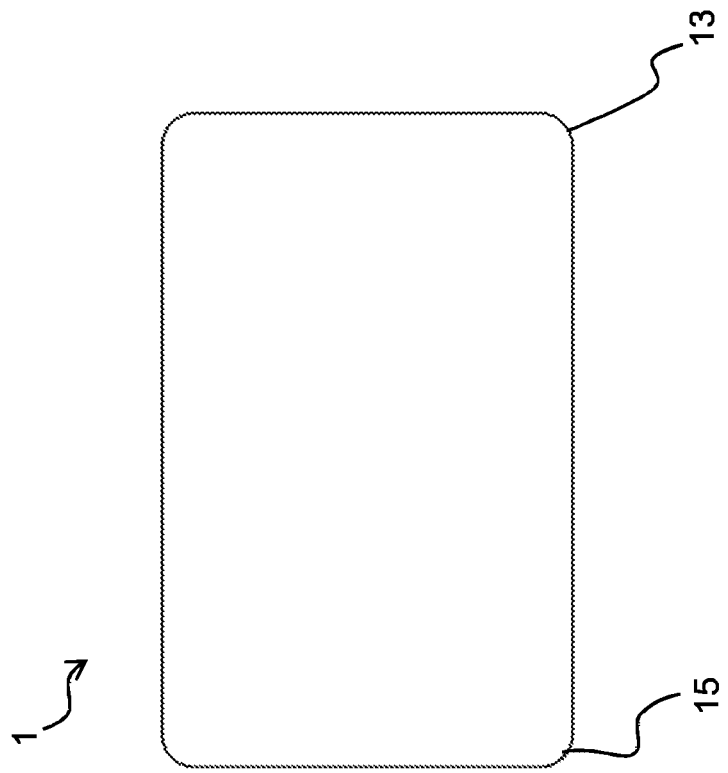
FIG. 4 shows a cross section through the piezoelectric transformer shown in FIG. 3.

FIG. 4 shows a cross section perpendicular to the longitudinal direction L through the piezoelectric transformer 1 shown in FIG. 3. In this case, it is apparent that the piezoelectric transformer 1 comprises rounded lateral edges 13.

The working frequency of the piezoelectric transformer 1 is essentially determined by the length thereof. If a length of 70 mm is selected, a working frequency of 50 kHz results. This working frequency is suitable, in particular, for activating or processing surfaces. A working frequency of 100 kHz can be advantageous for medical applications. Therefore, a length of the piezoelectric transformer 1 of 35 mm is selected in this case.

LIST OF REFERENCE NUMBERS

1 Piezoelectric transformer
2 Input region
3 Output region
4 Electrode
5 Piezoelectric material 6 First longitudinal side
7 Second longitudinal side
8 First external electrode
9 Piezoelectric material
10 Output-side end face
11 Ignition of plasma on the output-side end face
12 Ignition of plasma on lateral edges
13 Lateral edge
14 Insulation layer
15 Rounded region
16 Third longitudinal side
17 Fourth longitudinal side
L Longitudinal direction
S Stacking direction

The invention claimed is:

1. A piezoelectric transformer
which is divided in the longitudinal direction into an input region and an output region,
wherein electrodes and piezoelectric material are alternately stacked in the input region and an alternating voltage can be applied to the electrodes in the input region,
wherein the output region comprises piezoelectric material which effectuates the build-up of an electrical field when alternating voltage is applied in the input region,
wherein the piezoelectric transformer has an output-side end face which faces away from the input region, and lateral edges which extend in the longitudinal direction,
wherein the piezoelectric transformer is designed for ionizing atoms or molecules at the output-side end face, thereby avoiding ionization of atoms or molecules at the lateral edges, and
wherein the output-side end face comprises rounded edges and rounded corners.

2. The piezoelectric transformer according to claim 1, wherein the lateral edges comprise a rounded region.

3. The piezoelectric transformer according to claim 2, wherein the rounded region extends at least from the output-side end face up to the middle of the output region.

4. A piezoelectric transformer according to claim 2, wherein the rounded region extends along the entire length of the lateral edges.

5. The piezoelectric transformer according to claim 2, wherein the lateral edges have a radius between 0.1 mm and 3 mm in the rounded region.

6. The piezoelectric transformer according to claim 2, wherein the rounded region was rounded by means of rubbing, grinding, or sandblasting.

7. The piezoelectric transformer according to claim 1, wherein the output region is at least partially coated with an insulation layer.

8. The piezoelectric transformer according to claim 7, wherein the insulation layer comprises a heat shrink tube.

9. The piezoelectric transformer according to claim 8, wherein the heat shrink tube terminates so as to be flush with the output-side end face or extends beyond the end face.

10. The piezoelectric transformer according to claim 7, wherein the insulation layer comprises at least one selected from silicone, a cured polymer, or a varnish.

11. The piezoelectric transformer according to claim 7, wherein the end face is free from the insulation coating.

12. The piezoelectric transformer according to claim 7, wherein the insulation layer has a thickness in the range from 0.1 mm to 3 mm.

13. The piezoelectric transformer according to claim 1, which is used for generating a cold atmospheric plasma.

14. The piezoelectric transformer according to claim 1, wherein said transformer is a Rosen-type transformer.

15. The piezoelectric transformer according to claim 1, wherein the output-side end face is suitable for generating a widely fanned plasma jet.

16. A device for generating atmospheric-pressure plasma, which comprises a piezoelectric transformer according to claim 1, which transformer is situated in a gas-filled volume.

17. The piezoelectric transformer according to claim 1, wherein the output-side end face is metallized.

18. The piezoelectric transformer according to claim 1, wherein the output-side end face is not metallized.

19. A piezoelectric transformer
which is divided in the longitudinal direction into an input region and an output region,
wherein electrodes and piezoelectric material are alternately stacked in the input region and an alternating voltage can be applied to the electrodes in the input region,
wherein the output region comprises piezoelectric material which effectuates the build-up of an electrical field when alternating voltage is applied in the input region,
wherein the piezoelectric transformer has an output-side end face which faces away from the input region, and lateral edges which extend in the longitudinal direction,
wherein the piezoelectric transformer is designed for ionizing atoms or molecules at the output-side end face, thereby avoiding ionization of atoms or molecules at the lateral edges,
wherein the output region is at least partially coated with an insulation layer, and
wherein the insulation layer comprises at least one a cured polymer or a varnish.

* * * * *